United States Patent
Chen et al.

(10) Patent No.: US 7,944,730 B2
(45) Date of Patent: May 17, 2011

(54) WRITE METHOD WITH VOLTAGE LINE TUNING

(75) Inventors: Yiran Chen, Eden Prairie, MN (US);
Hai Li, Eden Praire, MN (US);
Wengzhong Zhu, Chanhassen, MN (US); Xiaobin Wang, Chanhassen, MN (US); Ran Wang, Bloomington, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 152 days.

(21) Appl. No.: 12/412,546

(22) Filed: Mar. 27, 2009

(65) Prior Publication Data

US 2010/0110762 A1    May 6, 2010

Related U.S. Application Data

(60) Provisional application No. 61/109,966, filed on Oct. 31, 2008.

(51) Int. Cl.
*G11C 11/00* (2006.01)
*G11C 7/00* (2006.01)
(52) U.S. Cl. ............... 365/148; 365/189.16; 365/189.07
(58) Field of Classification Search .................. None
See application file for complete search history.

(56) References Cited

U.S. PATENT DOCUMENTS

| | | | |
|---|---|---|---|
| 6,433,521 B1 | 8/2002 | Chen | |
| 7,023,724 B2* | 4/2006 | Katti | 365/158 |
| 7,187,577 B1 | 3/2007 | Wang | |
| 7,224,601 B2 | 5/2007 | Panchula | |
| 7,272,034 B1 | 9/2007 | Chen | |
| 7,272,035 B1 | 9/2007 | Chen | |
| 7,289,356 B2 | 10/2007 | Diao | |
| 7,345,912 B2 | 3/2008 | Luo | |
| 7,379,327 B2 | 5/2008 | Chen | |
| 7,502,249 B1 | 3/2009 | Ding | |
| 7,515,457 B2 | 4/2009 | Chen | |
| 2006/0023495 A1* | 2/2006 | Rinerson et al. | 365/158 |
| 2008/0310213 A1 | 12/2008 | Chen | |
| 2008/0310219 A1 | 12/2008 | Chen | |
| 2009/0040855 A1 | 2/2009 | Luo | |
| 2009/0185410 A1 | 7/2009 | Huai | |

* cited by examiner

*Primary Examiner* — Hoai V Ho
*Assistant Examiner* — James G Norman
(74) *Attorney, Agent, or Firm* — Campbell Nelson Whipps, LLC

(57) ABSTRACT

A method of writing to a resistive sense memory unit includes applying a first voltage across a resistive sense memory cell and a semiconductor transistor to write a first data state to the resistive sense memory cell. The first voltage forms a first write current for a first time duration through the resistive sense memory cell in a first direction. Then the method includes applying a second voltage across the resistive sense memory cell and the transistor to write a second data state to the resistive sense memory cell. The second voltage forms a second write current for a second duration through the resistive sense memory cell in a second direction. The second direction opposes the first direction, the first voltage has a different value than the second voltage, and the first duration is substantially the same as the second duration.

18 Claims, 4 Drawing Sheets

WRITE METHOD WITH VOLTAGE LINE TUNING

RELATED APPLICATIONS

This application claims priority to U.S. provisional patent application No. 61/109,966, filed on Oct. 31, 2008 and titled "Write Scheme with Bitline/Sourceline Tuning for Breakdown Prevention". The entire disclosure of application No. 61/109,966 is incorporated herein by reference.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe.

An MRAM write mechanism called Spin-Transfer Torque RAM (STRAM) uses a (bidirectional) current through the MTJ to realize the resistance switching. The switching mechanism of STRAM is constrained locally and STRAM is believed to have a better scaling property than the conventional MRAM.

However, a number of yield-limiting factors should be overcome before STRAM enters the production stage. One concern in traditional STRAM design is that the switching current through the STRAM and transistor is asymmetric depending on the direction of the switching current. This asymmetric switching current can cause reduced reliability of the STRAM.

BRIEF SUMMARY

The present disclosure relates to methods of writing to a resistive sense memory unit. In particular, the present disclosure relates to providing a symmetric switching time of a resistive sense memory unit when writing different data states to the resistive sense memory unit.

In one particular embodiment, a method of writing to a resistive sense memory unit includes applying a first voltage across a resistive sense memory cell and a transistor to write a first data state to the resistive sense memory cell. The first voltage forms a first write current for a first time duration through the resistive sense memory cell in a first direction. Then the method includes applying a second voltage across the resistive sense memory cell and the transistor to write a second data state to the resistive sense memory cell. The second voltage forms a second write current for a second duration through the resistive sense memory cell in a second direction. The second direction opposes the first direction. The first voltage has a different value than the second voltage, and the first duration is substantially the same as the second duration.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to methods of writing to a resistive sense memory unit. In particular, the present disclosure relates to providing a symmetric write duration of a resistive sense memory unit when writing different data states to the resistive sense memory unit. The disclosed write scheme can prevent the MTJ (magnetic tunneling junction) breakdown of a resistive sense memory unit that is due to the unnecessarily high driving strength of a semiconductor transistor in one-MTJ-one-transistor structure. The voltage of the bitline or sourceline is adjusted to balance the bidirectional driving current, based on the actual value written into the resistive sense memory. Alternatively or in addition, the voltage across the gate of the semiconductor transistor can be adjusted to balance the bidirectional driving current, based on the actual value written into the resistive sense memory. As a result, a symmetric write duration is provided in both driving directions of MTJ. While the present disclosure is not so limited, an appreciation of various aspects of the disclosure will be gained through a discussion of the examples provided below.

Figure 1:
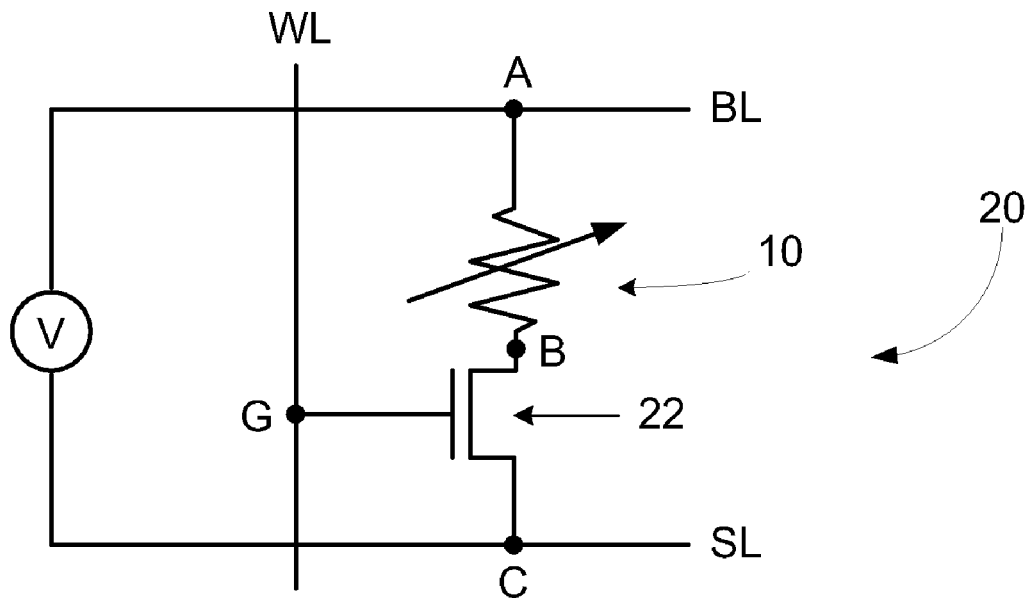
FIG. 1 is a schematic circuit diagram of an illustrative resistive sense memory unit.

FIG. 1 is a schematic circuit diagram of a resistive sense memory unit 20. The resistive sense memory unit 20 includes a resistive sense memory cell 10 (e.g., a spin-torque transfer memory cell or a phase-change memory cell) configured to switch between a high resistance state and a low resistance state upon passing a current through the resistive sense memory cell 10. A semiconductor transistor 22 is in serial electrical connection with the resistive sense memory cell 10. The semiconductor transistor 22 is electrically coupled to a wordline WL. A sourceline SL is electrically coupled to the semiconductor transistor 22. A bitline BL is electrically coupled to the resistive sense memory cell 10.

One illustrative design of resistive sense memory cell is a so called "1T1M" (one transistor 22 plus one resistive sense memory cell 10) or in some embodiments, a "1T1J" (one transistor 22 plus one magnetic tunnel junction 10) as show in FIG. 1. The direction of the driving current across the resistive sense memory cell (e.g., magnetic tunnel junction) 10 is determined by the voltage levels of bitline BL and sourceline SL. A semiconductor transistor 22 controlled by a word line WL is used to select the memory cell 10. In many embodiments the semiconductor transistor 22 is a PMOS or an NMOS semiconductor transistor device.

When driving a current from A to B, the bitline BL and the wordline WL are charged to VDD while the sourceline SL is drawn down to GND (0V). When driving a current from B to A, the bitline BL is drawn down to GND (0V) while sourceline SL and wordline WL are charged to $V_{DD}$. However, the semiconductor transistor 22 in 1T1J structure has an asymmetric driving strength at driving directions A→B and B→A. Specifically, the driving current from B to A suffers from more driving strength degradation because of a simultaneous $V_{GS}$ and $V_{DS}$ decrease. Therefore, in practical circuit design, a NMOS transistor with a sufficient large size is adopted to ensure enough driving strength in driving from B to A. However, this introduces an unnecessary large writing current to the resistive sense memory cell or MTJ, when driving current from A to B and may cause MTJ breakdown due to the voltage exceeding a breakdown voltage of the MTJ. Ideally, a symmetric driving strength (e.g., write current duration) of NMOS transistor for both driving directions can enhance the reliability of the resistive sense memory cell on a 1T1J design.

This disclosure describes a method to limit the driving strength of the semiconductor transistor associated with a resistive sense memory cell, by controlling the voltage of the bitline BL and sourceline SL, for different driving directions. Note that the direction from B to A is a so called "bad" driving direction that provides a smaller driving current to the MTJ than the driving direction from A to B, under the same biasing condition. Therefore, the MTJ breakdown is less possible to occur at such a case. In many embodiments, adjusting the driving voltage is applied to the driving direction from A to B.

Figure 2A:
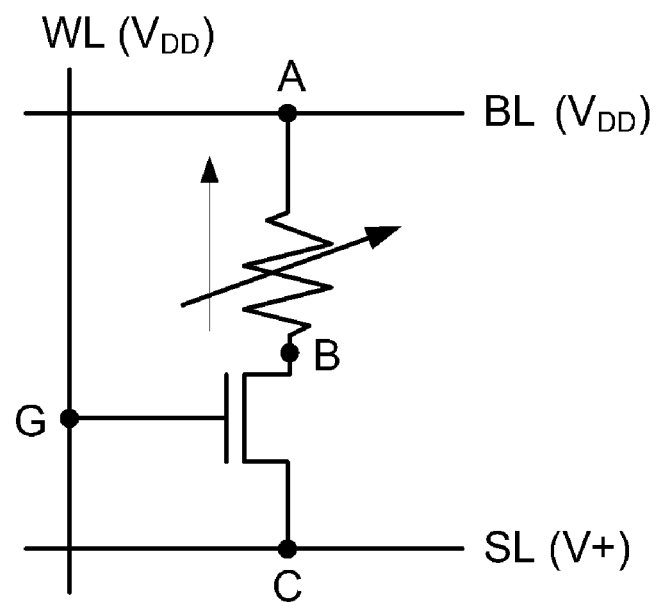
FIG. 2A is a schematic circuit diagram illustrating sourceline tuning.

FIG. 2A is a schematic circuit diagram illustrating sourceline tuning. The first example is described as "sourceline tuning". When driving current from B to A, the sourceline SL voltage is set to a value slightly higher than ground, for example, V+ and the wordline and bit line is set to $V_{DD}$. This design reduces $V_{GS}$ and $V_{DS}$, while introduces the negative body biasing to the semiconductor transistor. These effects reduce the driving strength of semiconductor transistor, and consequently, avoid the occurrence of MTJ breakdown due to large driving current. V+ is selected to provide a symmetric write duration to the resistive sense memory cell (e.g., MTJ), as the direction from B to A requires.

Figure 2B:
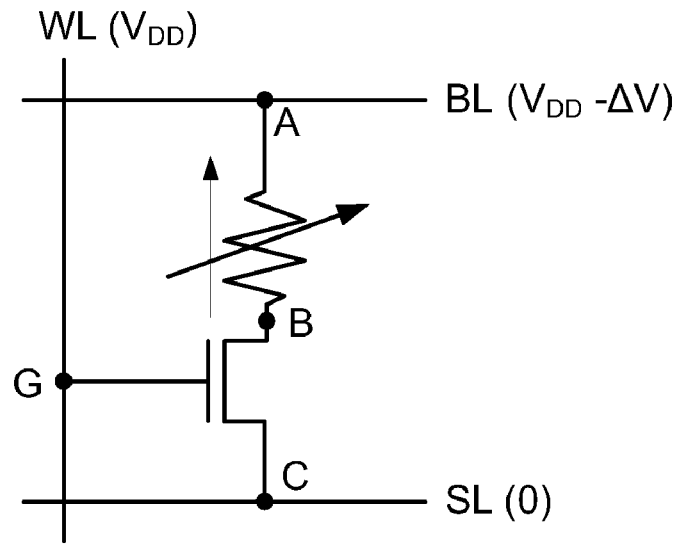
FIG. 2B is a schematic circuit diagram illustrating bitline tuning.

FIG. 2B is a schematic circuit diagram illustrating bitline tuning. The second example is described as "bitline tuning". When driving current from B to A, the bitline BL voltage is set to a value slightly lower than VDD, for example, $V_{DD-\Delta V}$ and the wordline is set to $V_{DD}$. This design reduces $V_{DS}$ only. Therefore, the driving strength of the semiconductor transistor is reduced. Consequently, the occurrence of MTJ breakdown due to large driving current can be reduced. Similarly, $\Delta V$ needs to be carefully selected to provide a symmetric driving current to the resistive sense memory cell (e.g., MTJ), as the direction from B to A requires.

Figure 2C:
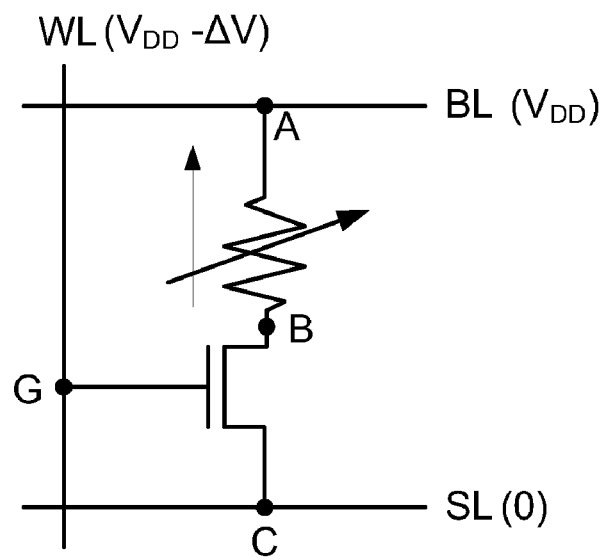
FIG. 2C is a schematic circuit diagram illustrating wordline tuning.

FIG. 2C is a schematic circuit diagram illustrating wordline tuning. A third example is described as "wordline tuning". When driving current from B to A, the wordline WL voltage is set to a value slightly lower than $V_{DD}$, say, for example, $V_{DD-\Delta V}$ and the bitline is set to $V_{DD}$. Therefore, the driving strength of the semiconductor transistor is reduced. Consequently, the occurrence of MTJ breakdown due to large driving current can be reduced. Similarly, $\Delta V$ needs to be carefully selected to provide a symmetric write duration to the resistive sense memory cell (e.g., MTJ), as the direction from B to A requires. This example can be combined with either the sourceline or bitline tuning examples above.

Note that the value of V+ and $\Delta V$ can be pre-characterized or pre-determined, based on the actual CMOS device performance and MTJ specification. The source and sink voltage regulators V providing the voltages of bitline BL and sourceline SL and wordline WL are adjusted accordingly.

In many embodiments, a method of writing to a resistive sense memory unit includes applying a first voltage across a resistive sense memory cell 10 and a semiconductor transistor 22 to write a first data state to the resistive sense memory cell 10. The first voltage forms a first write current for a first time duration through the resistive sense memory cell 10 in a first direction, for example from B to A. Then the method includes applying a second voltage across the resistive sense memory cell 10 and the semiconductor transistor 22 to write a second data state to the resistive sense memory cell 10. The second voltage forms a second write current for a second time duration through the resistive sense memory cell 10 in a second direction, for example from A to B. The second direction opposes the first direction, the first voltage has a different value than the second voltage, and the first time duration is substantially the same as the second time duration.

In illustrative embodiments, a method of writing to a resistive sense memory unit includes applying a first voltage across a bitline BL and a sourceline SL, a resistive sense memory cell 10 and a semiconductor transistor 22 are in serial electrical connection electrically between the bitline BL and the sourceline SL. The resistive sense memory cell 10 is electrically between the semiconductor transistor 22 and the bitline BL. The first voltage forms a first write current for a first time duration from the sourceline SL to the bitline BL and writing a first data state to the resistive sense memory cell 10. Then the method includes applying a second voltage across the bitline BL and the sourceline SL, the second voltage forms a second write current for a second time duration from the bitline BL to the sourceline SL and writing a second data state to the resistive sense memory cell 10. The first voltage being a greater value than the second voltage, and the first time duration being substantially the same as the second time duration. In some embodiments, the second voltage is adjusted by increasing the sourceline voltage value. In other embodiments, the second voltage is adjusted by decreasing the bitline voltage value. In many embodiments, the second write current is approximately a minimum current needed to write the second data state to the resistive sense memory cell, thus, a maximum safety margin is maintained to avoid the resistive sense memory unit from exceeding its maximum breakdown voltage.

In further embodiments, a method of writing to a resistive sense memory unit includes applying a first voltage across a bitline BL and a sourceline SL, a resistive sense memory cell 10 and a semiconductor transistor 22 are in serial electrical connection electrically between the bitline BL and the sourceline SL. The resistive sense memory cell 10 is electrically between the semiconductor transistor 22 and the bitline BL. The method includes applying a first gate voltage across a gate of the semiconductor transistor 22 to allow the first voltage to form a first write current first time duration from the sourceline SL to the bitline BL and writing a first data state to the resistive sense memory cell 10. Then the method includes applying a second voltage across the bitline BL and the sourceline SL and applying a second gate voltage across the gate of the semiconductor transistor 22 to allow the second voltage to form a second write current second time duration from the bitline BL to the sourceline SL and writing a second data state to the resistive sense memory cell 10. The first gate voltage having a different value than the second gate voltage, and the first time duration being substantially the same as the second time duration. As described above, the second write current can be approximately a minimum current needed to write the second data state to the resistive sense memory cell. In some embodiments, the second voltage value is different than the first voltage value and the second voltage value is adjusted by increasing a source line SL voltage value. In other embodiments, the second voltage value is different than the first voltage value and the second voltage is adjusted by decreasing a bitline BL voltage value.

Figure 3:
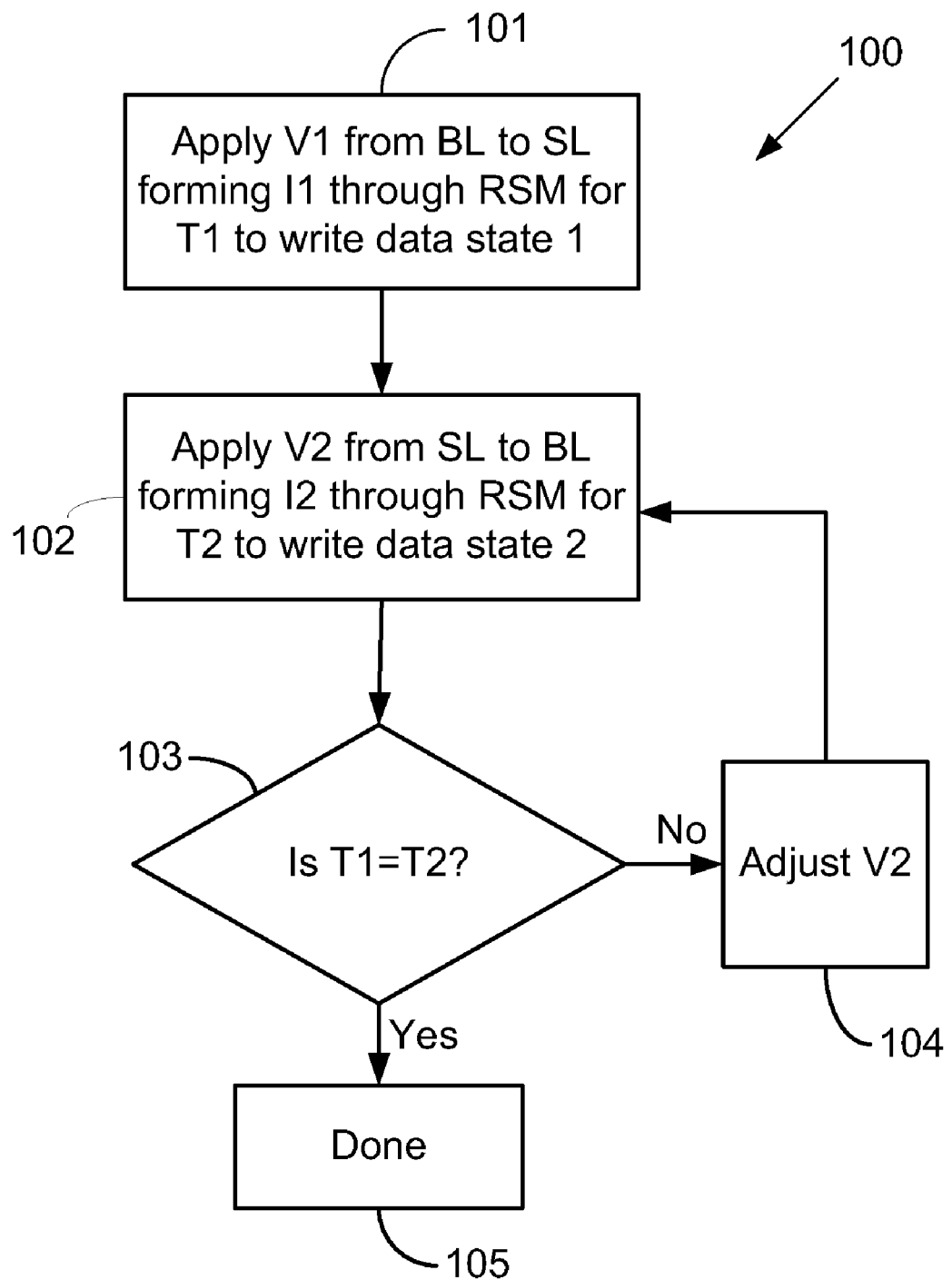
FIG. 3 is a flow diagram for writing to a resistive sense memory unit.

FIG. 3 is a flow diagram for writing to a resistive sense memory unit 100. The method includes applying a first applying a first voltage V1 from a bitline BL to a sourceline SL forming a first write current I1 through a resistive sense memory cell RSM and writing a data state 1, at block 101. Then the method includes applying a second voltage V2 from the source line SL to the bitline BL forming a second write current I2 through a resistive sense memory cell RSM and writing a data state 2, at block 102. If, at decision block 103, the first time duration T1 is equal to the second time duration T2, then the method proceeds to block 105 and is done. However, if the first time duration T1 is not equal to the second time duration T2, then the method proceeds to block 104 to adjust the second voltage V2 and returns to block 102. The second voltage can be adjusted by increasing the sourceline SL voltage value or decreasing the bitline BL voltage value, as described above.

Figure 4:
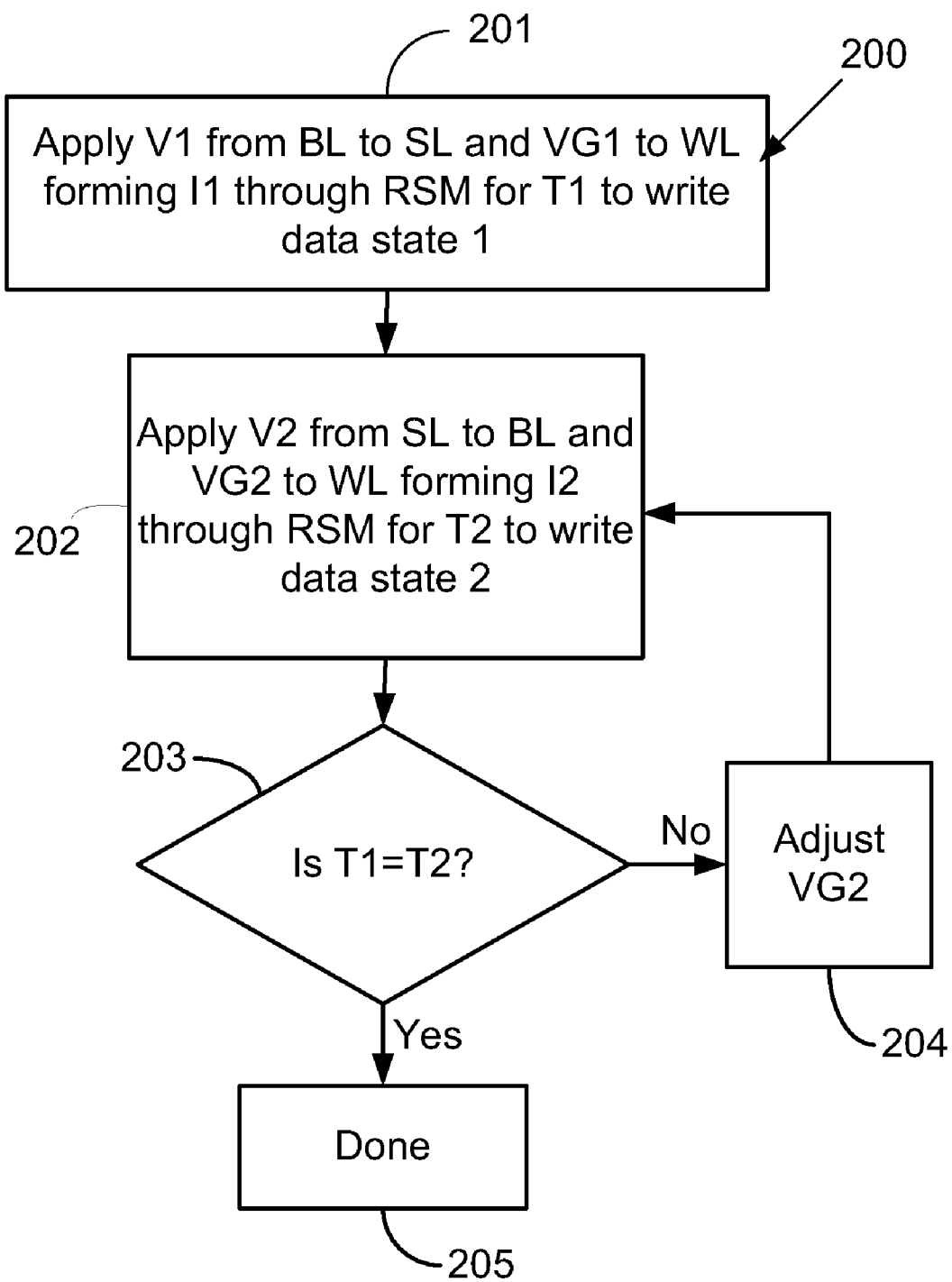
FIG. 4 is another flow diagram for writing to a resistive sense memory unit.

FIG. 4 is another flow diagram for writing to a resistive sense memory unit 200. The method includes applying a first applying a first voltage V1 from a bitline BL to a sourceline SL and a first gate voltage VG1 to the gate of the semiconductor transistor 22 forming a first write current I1 through a resistive sense memory cell RSM and writing a data state 1, at block 201. Then the method includes applying a second voltage V2 from the source line SL to the bitline BL and a second gate voltage VG2 to the gate of the semiconductor transistor 22 forming a second write current I2 through a resistive sense memory cell RSM and writing a data state 2, at block 202. If, at decision block 203, the first time duration T1 is equal to the second time duration T2, then the method proceed to block 205 and is done. However, if the first time duration T1 is not equal to the second time duration T2, then the method proceeds to block 204 to adjust the second gate voltage VG2 and returns to block 202.

Thus, embodiments of the WRITE METHOD WITH VOLTAGE LINE TUNING are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of writing to a resistive sense memory unit, comprising:
applying a first voltage across a resistive sense memory cell and a transistor to write a first data state to the resistive sense memory cell, the first voltage forming a first write current for a first time duration through the resistive sense memory cell in a first direction;
applying a second voltage across the resistive sense memory cell and the transistor to write a second data state to the resistive sense memory cell, the second voltage forming a second write current for a second time duration through the resistive sense memory cell in a second direction, the second direction opposing the first direction, the first voltage having a different value than the second voltage, and the first time duration being substantially the same as the second time duration;
wherein the resistive sense memory cell and the transistor are in serial electrical contact and the resistive sense memory cell is in electrical contact with a bitline and the transistor is in electrical contact with a sourceline, and the transistor has a gate in electrical contact with a wordline and the first voltage is greater than the second voltage and the first voltage comprises a sourceline voltage being greater than a bitline voltage.

2. A method according to claim 1, wherein the resistive sense memory cell comprises a spin-torque transfer memory cell.

3. A method according to claim 1, wherein the second voltage comprises a sourceline voltage value that is greater than the bitline voltage for the first voltage.

4. A method according to claim 1, wherein the second voltage comprises a bitline voltage value that is less than the sourceline voltage for the first voltage.

5. A method according to claim 1, wherein the transistor is an n-type metal-oxide semiconductor transistor.

6. A method according to claim 1, wherein the second write current is approximately a minimum current needed to write the second data state to the resistive sense memory cell.

7. A method of writing to a resistive sense memory unit, comprising:
applying a first voltage across a bitline and a sourceline, wherein a resistive sense memory cell and a transistor are in serial electrical connection electrically between the bitline and the sourceline, and the resistive sense memory cell is electrically between the transistor and the bitline, the first voltage forming a first write current time duration from the sourceline to the bitline and writing a first data state to the resistive sense memory cell;

applying a second voltage across the bitline and the sourceline, the second voltage forming a second write current time duration from the bitline to the sourceline and writing a second data state to the resistive sense memory cell, the first voltage being a greater value than the second voltage, and the first write current time duration being substantially the same as the second write current time duration.

8. A method according to claim 7, wherein the resistive sense memory cell comprises a spin-torque transfer memory cell.

9. A method according to claim 7, wherein the second write current is approximately a minimum current needed to write the second data state to the resistive sense memory cell.

10. A method according to claim 7, wherein the second voltage is adjusted by increasing a sourceline voltage value.

11. A method according to claim 10, wherein the sourceline voltage adjustment amount is predetermined based on specifications of the resistive sense memory cell and the transistor.

12. A method according to claim 7, wherein the second voltage is adjusted by decreasing a bitline voltage value.

13. A method according to claim 12, wherein the bitline voltage adjustment amount is predetermined based on specifications of the resistive sense memory cell and the transistor.

14. A method according to claim 7, wherein the second voltage is adjusted by decreasing a wordline voltage value.

15. A method of writing to a resistive sense memory unit, comprising:
applying a first voltage across a bitline and a sourceline, a resistive sense memory cell and a semiconductor transistor are in serial electrical connection electrically between the bitline and the sourceline, the resistive sense memory cell electrically between the semiconductor transistor and the bitline;
applying a first gate voltage across a gate of the semiconductor transistor to allow the first voltage to form a first write current for a first time duration from the sourceline to the bitline and writing a first data state to the resistive sense memory cell
applying a second voltage across the bitline and the sourceline,
applying a second gate voltage across the gate of the semiconductor transistor to allow the second voltage to form a second write current for a second time duration from the bitline to the sourceline and writing a second data state to the resistive sense memory cell, the first gate voltage having a different value than the second gate voltage, and the first time duration being substantially the same as the second time duration.

16. A method according to claim 15, wherein the second write current is approximately a minimum current needed to write the second data state to the resistive sense memory cell.

17. A method according to claim 15, wherein the second voltage value is different than the first voltage value and the second voltage value is adjusted by increasing a sourceline voltage value.

18. A method according to claim 15, wherein the second voltage value is different than the first voltage value and the second voltage is adjusted by decreasing a bitline voltage value.

* * * * *